United States Patent [19]

Piegari

[11] Patent Number: 4,845,380

[45] Date of Patent: Jul. 4, 1989

[54] MODULAR POWER CONTROLLER ASSEMBLY

[75] Inventor: William A. Piegari, Westfield, N.J.

[73] Assignee: General Electronic Engineering, Inc., Rahway, N.J.

[21] Appl. No.: 947,916

[22] Filed: Dec. 29, 1986

[51] Int. Cl.$^4$ ............................ H02J 1/00; H05K 7/14
[52] U.S. Cl. .................................... 307/149; 361/415; 323/318
[58] Field of Search ................. 307/149, 85; 361/396, 361/421, 427, 415; 363/141; 323/318

[56] References Cited

U.S. PATENT DOCUMENTS

| | | | |
|---|---|---|---|
| 3,958,075 | 5/1976 | Kaufman | 361/421 X |
| 4,085,433 | 4/1978 | Baranowski | 361/396 |
| 4,618,817 | 10/1986 | Holtslander | 361/427 X |

Primary Examiner—William M. Shoop, Jr.
Assistant Examiner—Sharon D. Logan
Attorney, Agent, or Firm—Siegmar Silber

[57] ABSTRACT

A modular power controller assembly is described for providing the application of power to resistive loads. The controller assembly comprises an enclosure for mounting controller modules, one or more modular heat-sinks, a plurality of SCR modules arranged in sets with each set on a corresponding heat sink, a timer board for controlling the percentage of time in the on-condition, and a driver board for switching each set of SCR modules. The timer board provides a controlled signal which optocoupled at the driver board with the gate of the corresponding SCR module. The SCR's switching is conducted at the zero cross over level thereby avoiding radio frequency interference.

10 Claims, 4 Drawing Sheets

MODULAR POWER CONTROLLER ASSEMBLY

BACKGROUND OF THE INVENTION

1. Field of the Invention

This invention relates to a modular power control, and more particularly to the parallel operation of solid state, silicon controlled rectifiers (SCRs). These rectifiers, because of the zero crossover firing inherent in the control circuitry, supply power to resistive loads without producing radio frequency interference. The best mode of practicing the invention contemplated hereby is in conjunction with resistance heaters with each controller serving a particular unit or group of units within a zone.

2. Discussion of the Prior Art

The within invention became increasingly feasible with the introduction of burst-firing silicon controlled rectifiers (SCRs) which are supplied in SCR packs having overlapping lead frames, ref. U.S. Pat. No. 3,958,075 to L. R. Kaufman.

SUMMARY OF THE INVENTION

The present invention discloses a modular power controller assembly having modules capable of being installed in the field or preassembled at the factory. The modular power controller assembly is shown in the description which follows as applied to the control of electric heating. Although shown for such purpose, the controller assembly may be used in applications where the control of numerous resistive loads is required. Because of the flexible arrangement inherent in the invention disclosed herein, there is no requirement that the resistive loads be uniform. Onto the enclosure, one or more heat sinks are mounted and in the particular best mode described herein, up to six SCR modules may be mounted thereon. The SCR modules are operable between an on-condition and an off-condition in response to a controlled signal. The control signal is developed at a timer board. The timer board in turn is a proportioning control device that in response to external control information develops a signal representing the time on proportioned to the total time of operation (or a percentage of time of operation). The control signal from the timer board is in turn provided to a driver board where it is optocoupled to the gate of the corresponding SCR module. The SCR's switching is conducted at the zero crossover level thereby avoiding radio frequency interference.

It is an object of this invention to provide an economic and efficient method of employing multiple SCR circuits.

It is another object of this invention to provide a a single logic circuit for firing of up to 36 SCR circuits.

It is still another object of this invention to provide a device for parallel firing of SCRs.

It is yet another object of this invention to provide an SCR power controller for applying power to individual resistive loads, and more specifically to resistance heating units or groups of said units.

It is a feature of this invention to provide a compact array of heat sinks for numerous SCRs utilizing a single enclosure.

Although numerous objects and features of the present invention have been presented above, other objects and a more complete understanding maya be had by referring to the following specifications and claims taken in conjunction with the accompanying drawings.

BRIEF DESCRIPTION OF THE DRAWINGS

As herein indicated, the invention may be best explained with reference to the drawings, in which.

DESCRIPTION OF THE PREFERRED EMBODIMENT

Figure 1:
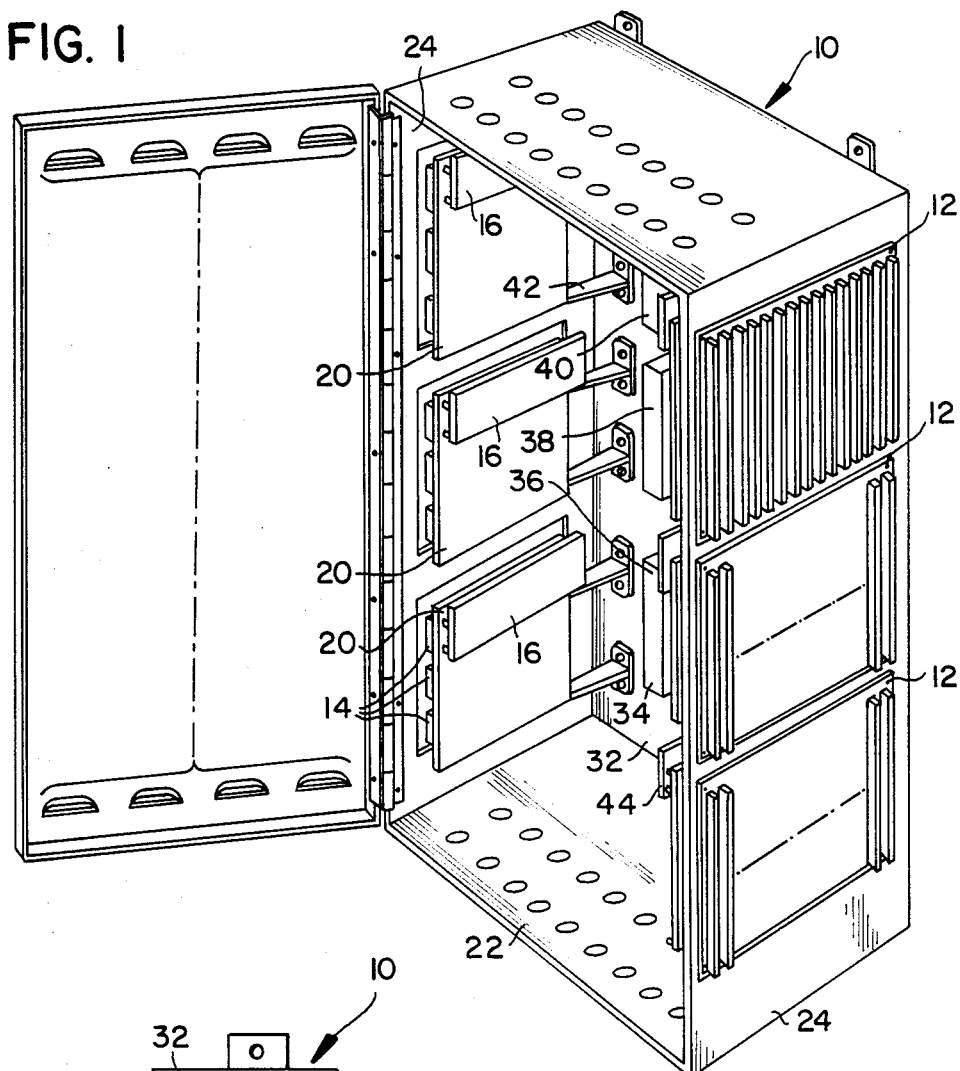
FIG. 1 is a perspective view of a modular power controller of this invention, said controller mounted in an enclosure and shown with the enclosure door open.

Referring now to FIG. 1, a perspective view of the modular power controller is shown, and referred to generally by reference designator 10. In the description which follows, a specific application, considered the best mode of practicing the present invention, is presented. The controllers are enclosed, solid-state, 3-phase controllers for providing continuous, variable, single-phase output to resistive loads, and more particularly for temperature-regulating applications including, but not limited to, electric convection heater units, radiant ceiling panels, infrared heaters, industrial process heating equipment, and duct heaters. Mounted on modular heat sinks 12 are power SCR modules 14 which are connected as gated bi-directional switches. A timer board 16 provides a variable control input signal 18 for predetermining the percentage of time on (0 to 100%) for the output power. For this function, a driver board 20 is provided for containing control circuits, which receives the variable control input signal 18, and, as is described in more detail hereinbelow, pulse firing the SCR modules.

Figure 2:
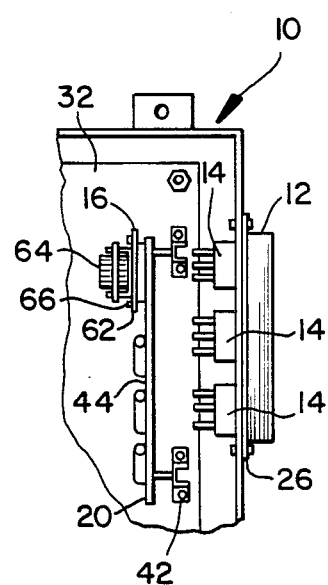
FIG. 2 is a side view of the MPC modular base assembly with six driver board assemblies mounted thereon and the associated timing board.
Figure 3:
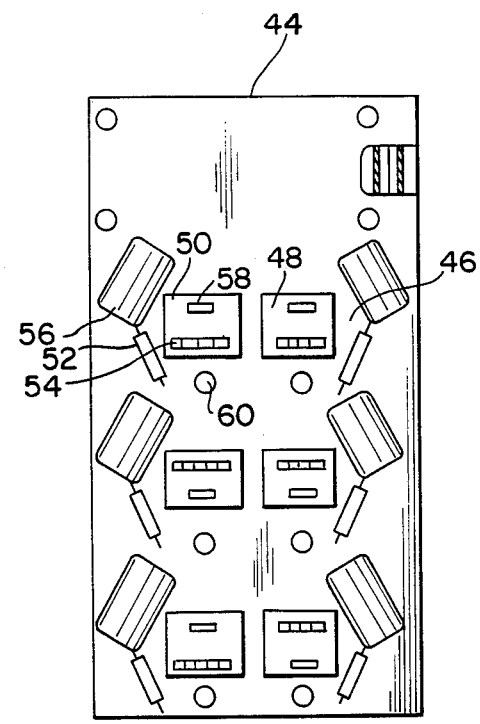
FIG. 3 is a top plan view of the MPC modular base assembly with six driver board assemblies mounted thereon and, for clarity, shown with the timing board removed.
Figure 4:
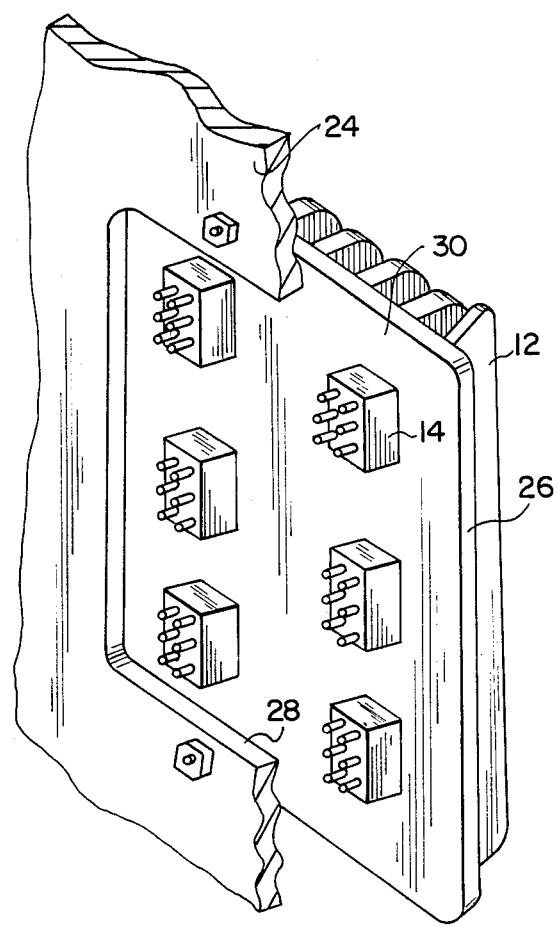
FIG. 4 is a perspective view of the heat sinks in relation to the SCRs of the modular units.
Figure 5:
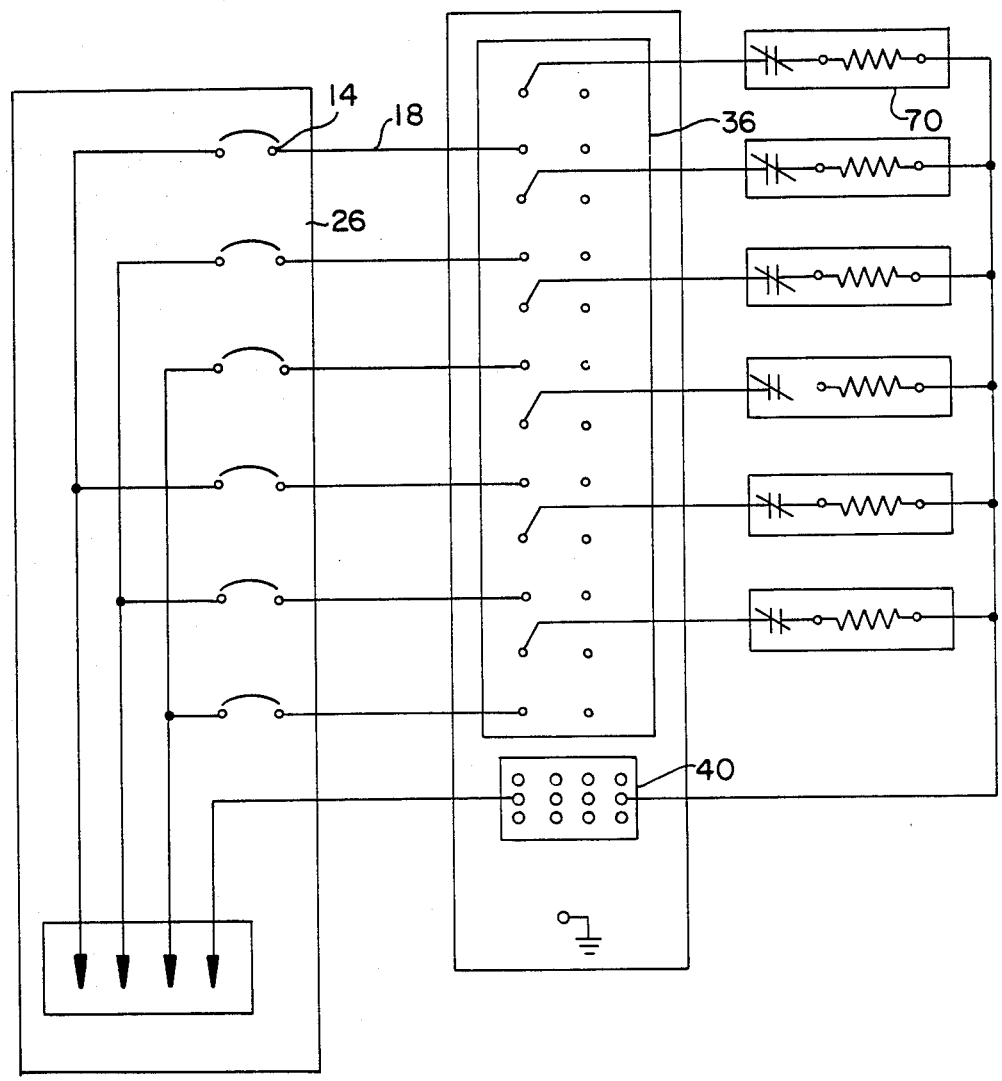
FIG. 5 is a block schematic diagram showing the modular power controller in relation to resistance heaters of an electrically heated building; and, FIG. 6 is a block diagram showing the equipment of FIG. 5 rearranged for another application within the same structure.
Figure 6:
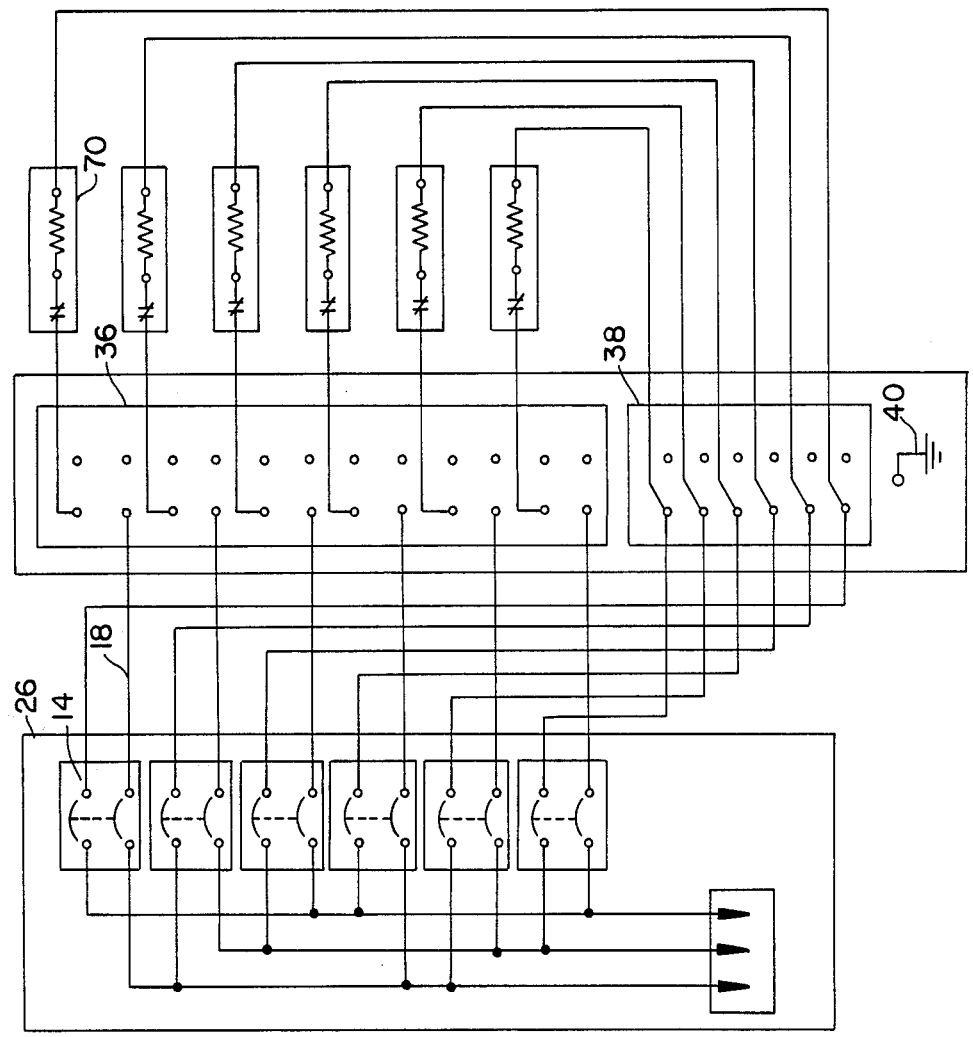

Referring now also to FIG. 2 through 6 the modular power controller 10 is shown. The various modules of the controller are mounted within and upon enclosure 22. On the side panels 24, and 26, up to six heat sinks 26 are attached for dissipating heat from the controller components. Each heat sink 26 is mounted over an access port 28. The interior side 30 of the heat sink 26 is provided for mounting up to six power switching SCR modules 14 (Model QQQX2 or equivalent, various ratings, Gentron Corporation, Milwaukee, Wisconsin). In constructing the power controller 10, each heat sink 26 is design rated by the load current controlled by the SCR modules mounted thereon. In the best mode presented herein, and the aggregate of the module ratings may be equal to or greater than the equipment load, which in turn, is not to exceed the heat sink rating of 96 amperes. Within the enclosure 22, full mounting panel 32 is structured for stud mounting therewithin and contains the basic control transformer 34 terminal strip 36 and 38 and neutral bus 40. To one side of terminal strip 36, driver board mounting brackets 42 are provided upon which are mounted, the driver board 44 with six drivers 46. The driver board 44 is structured to include a 908 dual driver type of Nand gate used for switching either 3 or 6 zones on the board on and off simultaneously. Each half of the drivers 46, in turn, are arranged to drive the optoisolators 48 (Catalog No. MOC 3020, Motorola, Phoenix, Arizone) and thereby provides for the zero-crossover firing. The triac section 50 of the opto-isolators 48 are optocoupled to a pair of antiparalled SCR modules and gate to gate firing thereof is provided thereby. For gate cathode protection, the driver board 44 is structured to include for each pair of SCR modules gate cathode protection resistor 52 and diode 54. For dV/dt protection, the driver board 44 is structured to include for each pair of SCR modules, DV/DT capacitor 56 and DV/DT resistor 58 connected in series thereacross. Each zone of the driver board services an SCR module 30 is provided with a load indicating device 60 indicating the on-condition of the resistive load. Mounted atop the driver board 44 is a timer board 62 for receiving a command signal for temperature control purposes and for providing a logic signal that determins the percentage of time the load is energergized, refer to FIG. 4. The timer board 62, FIG. 2, are rated to power up to six driver boards simultaneously, but are shown as driving only two. The power transformer 64 of timer board 62 and associated timing and output circuitry 66 is included on the printed circuit board.

In operation, a command signal demanding a proportional time on for the resistive load 70 is received by the timing board. In the typical application that of electric perimeter heating in a large office building, a control system serving a zone thereof provides a command signal which the timer board 62 of the modular power controller assembly 10 interprets as a proportioning control signal. The control signal, in turn, is provided to the driver board where optocoupling with the SCR modules occurs and gate-to-gate zero crossover switching of the SCR modules is initiated in accordance with the control requirements. As all switching occurs at or near the zero crossover point no radio frequency interference is experienced. With the above arrangement zones within a building can be restructured in the field as changes in building utilization patterns occur. Thus, if a building were to be divided into several smaller occupancies, field modification of the modular power controller would facilitate re-arrangement of the controls to provide localized control for each tenancy. This might take the form of simply adding an additional timer board and distributing the convection heating units for the respective occupancies to the appropriate timer boards.

While a particular embodiment of the instant invention has been shown and described, it will be obvious to those skilled in the art to make various changes and modifications without departing from the spirit of the invention and it is understood taht such changes and variations are considered to be within the scope of the claims which follows.

What is claimed is:

1. A power controller assembly having modules capable of being assembled for power control of a plurality of resistive loads, said controller assembly providing the application of power for each resistive load, the controller assembly comprising the combination of:
    an enclosure for mounting controller modules, said enclosure having an exterior and an interior;
    at least one modular heat-sink means for dissipating heat from said power controller, said heat sink means attached to said exterior of said enclosure with access by said power controller to said heat sink means from said interior of said enclosure;
    at least one set of SCR modules, in turn, comprising:
    a plurality of SCR modules attached to the modular heat-sink means at the interior access area thereof, said SCR modules being operable between an on-condition and an off-condition, said plurality of SCR modules having an aggregate amperage rating of a predetermined amount;
    a timer board for proportioning the ratio of the time of said on-condition to cycle time in accordance with predetermined output requirement and providing a control signal in response to; and,
    a driver board for switching each set of SCR modules by coupling said control signal with the corresponding SCR modules;
    whereby said plurality of SCR modules are attached to said heat sink and housed within said enclosure without requiring additional heat ejection means.

2. A power controller assembly as in claim 1 wherein said control signal is fed in parallel to each of said corresponding SCR modules.

3. A power controller assembly as in claim 2 wherein the switching of said SCR modules is gate-to-gate switching at the zero crossover level.

4. A power controller assembly as in claim 3 wherein said driver board further comprises optocoupling means for coupling said control signal with the corresponding SCR modules.

5. A power controller assembly as in claim 4 wherein said optocoupling means is an opto-isolator.

6. A power controller assembly as in claim 1 wherein said plurality of SCR modules have an aggregate amperage rating of at least 40 amperes.

7. A power controller assembly as in claim 6 wherein the aggregate amperage rating is no more than 96 amperes.

8. A power controller assembly as in claim 1 wherein said resistive loads are electric heating units.

9. A power controller assembly as in claim 8 wherein each said set of SCR modules control the electric heating units in a zone of a building in response to a control signal provided by said timer board.

10. A power controller assembly as in claim 9 wherein said driver board further includes an indicator means indicating the on condition for the SCR module control thereby.

* * * * *